(12) United States Patent
Xia et al.

(10) Patent No.: US 8,093,575 B2
(45) Date of Patent: Jan. 10, 2012

(54) MEMRISTIVE DEVICE WITH A BI-METALLIC ELECTRODE

(75) Inventors: Qiangfei Xia, Menlo Park, CA (US); Xuema Li, East Palo Alto, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 192 days.

(21) Appl. No.: 12/426,647

(22) Filed: Apr. 20, 2009

(65) Prior Publication Data

US 2010/0264397 A1 Oct. 21, 2010

(51) Int. Cl.
*H01L 29/02* (2006.01)
(52) U.S. Cl. .. 257/4; 257/2; 257/3; 257/5; 257/E29.002; 257/E45.002; 438/660
(58) Field of Classification Search .................. 257/2–5, 257/E45.002, E29.002; 438/660
See application file for complete search history.

(56) References Cited

U.S. PATENT DOCUMENTS

| 4,203,800 A | 5/1980 | Kitcher et al. |
| 2008/0079029 A1 | 4/2008 | Williams |
| 2008/0090337 A1 | 4/2008 | Williams |
| 2010/0117053 A1* | 5/2010 | Sekar et al. ............... 257/4 |

FOREIGN PATENT DOCUMENTS

WO　WO 2010068221　*　6/2010

* cited by examiner

*Primary Examiner* — Jenny L Wagner
*Assistant Examiner* — Jami M Valentine

(57) ABSTRACT

A memristive device having a bimetallic electrode includes a memristive matrix, a first electrode and a second electrode. The first electrode is in electrical contact with the memristive matrix and the second electrode is in electrical contact with the memristive matrix and an underlying layer. At least one of the first and second electrodes is a bimetallic electrode which includes a conducting layer and a metallic layer.

19 Claims, 11 Drawing Sheets

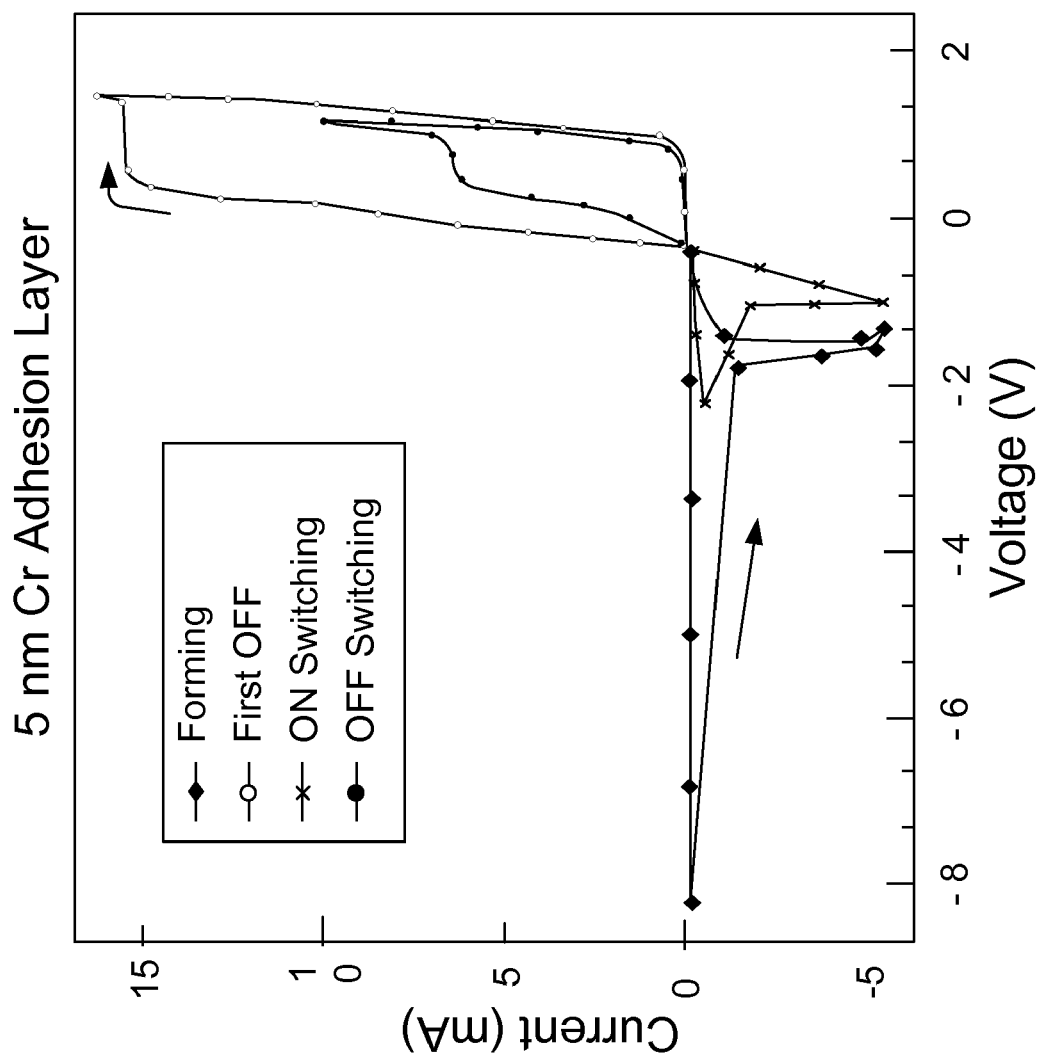
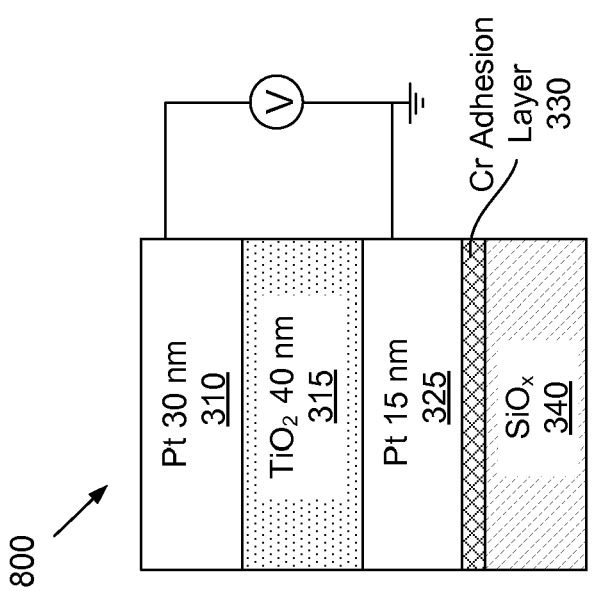

MEMRISTIVE DEVICE WITH A BI-METALLIC ELECTRODE

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. These changing dopant configurations within a matrix can be exhibited as changes in the electrical resistance of the device. The dopant configurations are a form of "memory" retained within the device which corresponds to past electrical conditions.

Devices which exhibit a "memory" of past electrical conditions are often called "memristors" or "memristive devices." Memristive behavior is most strongly evident in nanometer scale devices and could potentially be used for high density data storage, circuit calibration, or to provide self programming, fuzzy logic, or neural learning capabilities. One of the fundamental challenges of implementing memristive devices is to integrate them with complimentary circuitry to perform high level tasks.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 8A is a cross-sectional diagram of an illustrative memristive element which has a chromium adhesion layer between a lower electrode and an underlying substrate, according to one embodiment of principles described herein.

FIG. 8B is a graph showing illustrative voltages and currents which have been applied to a memristive element with a chromium adhesion layer, according to one illustrative embodiment of principles described herein.

Throughout the drawings, identical reference numbers designate similar, but not necessarily identical, elements.

DETAILED DESCRIPTION

Figure 1A:
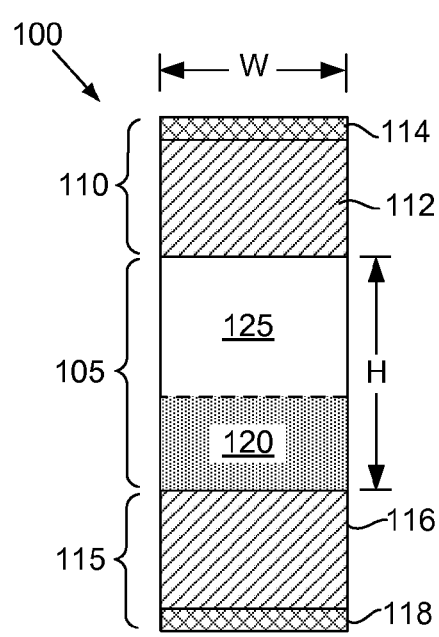
FIGS. 1A-1D are diagrams of the configuration and operation of an illustrative memristive device, according to one embodiment of principles described herein.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Examples of systems which could benefit from a retained memory of past conditions may include: switching devices; self programming circuit elements; memory devices capable of multi-state storage; solid state elements which can be used to tune circuits; analog neuronal computing devices which share fundamental functionalities with the human brain; and electronic devices for applying fuzzy logic processes.

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field.

Throughout the specification and appended claims, the term "memristor" or "memristive" is used to describe a combination of an insulating/semiconductor matrix and a dopant which exhibits dopant motion in the presence of a programming electrical field and the desired long term dopant stability within the matrix when the programming field is removed. The memristive effect is most strongly evident in nanometer scale devices and allows the device to "remember" past electrical conditions.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 2008/0079029, entitled "Multi-terminal Electrically Actuated Switch" and U.S. Patent App. Pub. No. 2008/0090337, entitled "Electrically Actuated Switch", both to R. Stanley Williams, which are hereby incorporated in their entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much voltage was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A shows an illustrative two-terminal memristive switch (100). According to one embodiment, the two-terminal memristive switch (100) is comprised of a first electrode (110) and a second electrode (115) which are in electrical and physical contact with the memristive matrix (105). The memristive matrix (105) may be initially comprised of two separate regions: a semiconducting region (125) which is not intentionally doped and a highly doped secondary region (120).

Throughout the specification and appended claims, the term "memristive matrix" describes a thin film of material that is electronically semiconducting or nominally electronically insulating and also a weakly ionic conductor. The memristive matrix is capable of transporting and hosting ions that act as dopants to control the flow of electrons through the switch. The basic mode of operation is to apply an electrical field (the drift field, which may exceed some threshold for enabling the motion of the ions in the memristive matrix) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. not intentionally doped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature. This ensures that the switch is nonvolatile, that is, that it holds its state after the drift field has been removed.

The matrix material (105) may be a thin film (generally less than 100 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material is frequently dominated by quantum mechanical tunneling of the electrons. When a semiconducting matrix material is essentially intrinsic at a junction with an electrode, the tunneling barrier is high and wide, and thus the conductivity through the switch is low (OFF state). When a significant number of dopant species have been injected into or distributed throughout the semiconductor, the width and perhaps the height of the tunneling barrier are diminished by the potential of the charged species. This results in an increase of the conductivity of the switch (ON state).

As noted above, the matrix material has certain properties that are useful in the practice of the present invention. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability. This desired level of stability avoids inadvertently turning the device from ON to OFF or vice versa via ionized species diffusion, but allows the intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). In contrast, "Strongly ionic conductors" would have large ionized species mobilities and thus would not be stable against diffusion.

Illustrative examples of suitable memristive matrix materials are given in Table 1, below. The table lists compatible primary materials, secondary materials, and dopant species for each memristive combinations. The primary material is typically a highly insulating stoichiometric compound. The secondary material is the source of the doping species for the primary material.

TABLE 1

List of Examples of Compatible Primary and Secondary Materials and Dopant Species

| Primary Material | Secondary Material | Dopant Species |
|---|---|---|
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

As can be seen from Table 1, a variety of memristive materials use oxygen vacancies as the mobile dopant. For example, titanium dioxide ($TiO_2$), zirconium dioxide ($ZrO_2$), hafnium dioxide ($HfO_2$), and strontium titanate ($SrTiO_3$) all use oxygen vacancies as mobile dopants.

FIG. 1A illustrates one potential "as manufactured" state of the memristive device (100). As discussed above, the first intrinsic layer (125) has very few dopants and prevents electrical current from flowing between the two electrodes (110, 115). A second highly doped layer (120) is conductive and serves as a source of dopants which can be moved into the first insulating layer (125) to change the overall electrical conductivity of the memristive matrix (105). Consequently, in the "as manufactured" state of the memristive device illustrated in FIG. 1A, the memristive switch (100) in an open circuit or OFF state.

The electrodes (110, 115) may be constructed from a variety of conducting materials, including but not limited to: metals, metal alloys, metal composite materials, nanostructured metal materials, or other suitable conducting materials. The electrodes (110, 115) may be comprised of one or more layers. According to one illustrative embodiment, the electrodes (110, 115) have two layers: a first conducting layer (112, 116) which generally has low reactivity with the surrounding materials; and a metallic protecting layer (114) or a metallic adhesion layer (118). The metallic protecting layer (114) and metallic adhesion layer (118) can be, for example, aluminum or chromium.

As used in the specification and appended claims, the term "bi-metallic electrode" refers to a structure which is manufactured as two distinct layers: a conducting layer and a second metallic layer. Despite subsequent reactions such as surface oxidization or diffusion of one layer into the other layer, any electrode which is initially formed with two distinct layers of two different metals is a bimetallic electrode. The bimetallic electrode may take a variety of forms including a wire, a pad, or more complex shapes. According to one illustrative embodiment, the bimetallic electrode includes less reactive metal layer and an adhesion or protective layer.

The memristive matrix (105) has a height of "H" and a width of "W" as shown in FIG. 1A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (110) and the second electrode (115) will produce the required electrical field intensity of 100,000 volts/centimeter through the memristive material (105). The application of a programming electrical field above a certain threshold allows the dopants to be moved through the memristive matrix.

Figure 1B:
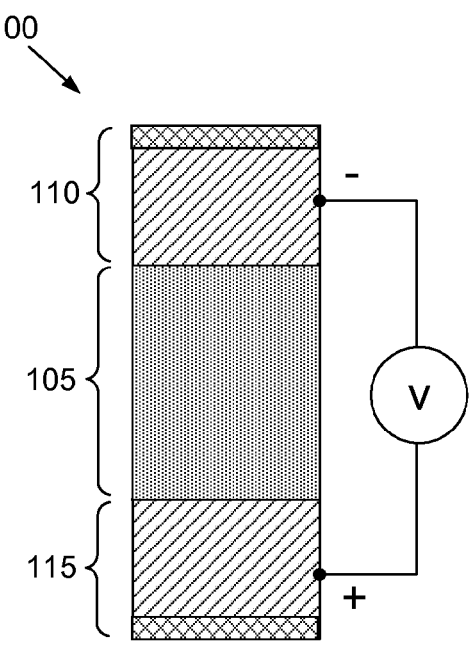

FIG. 1B illustrates a forming voltage which is applied to the memristive device (100). The forming voltage results in an electrical field which facilitates not only the movement of dopants from the highly doped region (120) into the intrinsic region (125) but also the creation of some native dopants, such as oxygen vacancies, via an electro-reduction process in oxide memristive materials. The polarity and voltage difference which is applied across the memristive matrix (105) may vary according to a variety of factors including, but not limited to: material properties, geometry, dopant species, temperature, and other factors. For example, when the ions are positively charged, the ions are repelled by positive voltage potentials and attracted to negative voltage potentials. For example, a positive voltage may be applied to the second electrode (115) and negative voltage may be applied to the first electrode (110).

According to one illustrative embodiment, the initial application of a voltage to the memristive device (100) may be used to form the junction and define its characteristics. This initial forming voltage may be higher than other applied voltages. The initial programming voltage may serve a number of functions which prepare the junction for further use. For example, the forming voltage may result in the initial creation of additional mobile dopants or the migration of the mobile dopants into more active regions of the memristive matrix, which reduces the effective thickness of the switching layer and causes an increased electric field with the same applied voltage. In addition, the electric field for dopant drift in the switching process is usually lower than that for dopant creation in the electroforming process. Consequently, lower programming voltages can be subsequently used to move the dopants after electroforming.

Figure 1C:
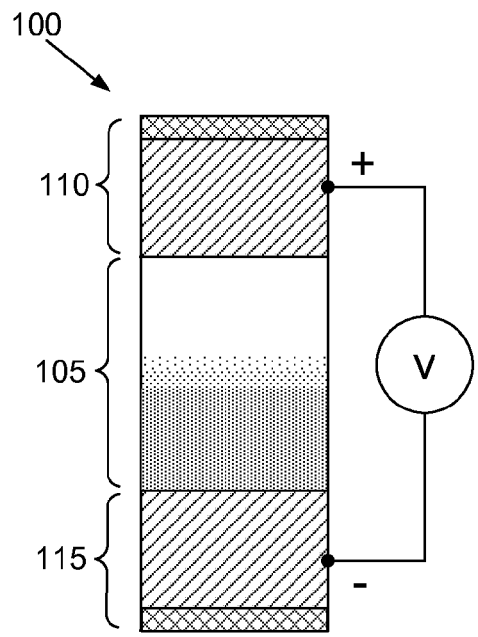
Figure 1D:
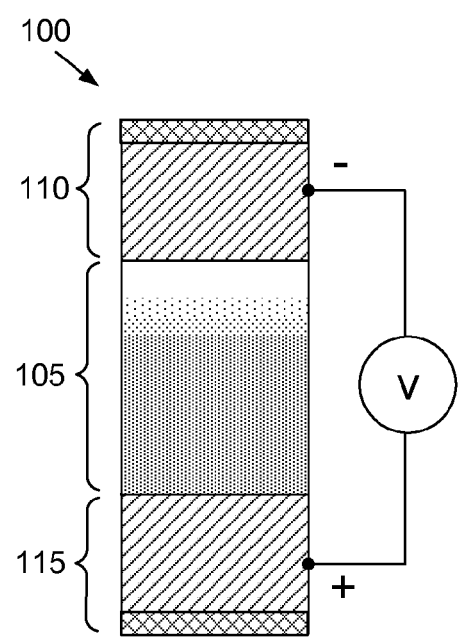

FIGS. 1C and 1D illustrate the normal switching operation of a memristive junction (100) after the forming voltage has been applied. FIG. 1C illustrates the application of a subsequent programming voltage V which has the opposite polarity of the forming voltage applied in FIG. 1B. This programming voltage V applies a positive voltage to the upper electrode and a negative voltage to the lower electrode. In the current example, the mobile dopant species are assumed to be positively charged. Consequently, these positively charged dopants migrate away from the upper electrode under the influence of the resulting electrical field and the junction is placed in a nonconductive or OFF state.

FIG. 1D illustrates the application of a subsequent programming voltage to the memristive junction (100) to return the junction to the ON state. Consequently, the applied programming voltage has the opposite polarity from the voltage illustrated in FIG. 1C. The mobile dopants move within the electrical field toward the upper electrode and reduce the electrical resistance of the memristive device (100). The overall electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

As briefly discussed above, memristors may be incorporated into a number of electrical devices, including memory arrays, integrated circuits, switches, multiplexers, demultiplexers, etc. According to one illustrative embodiment, memristors may be incorporated into a crossbar architecture. A crossbar architecture typically comprises a lower set of generally parallel wires which are overlaid by an upper set of perpendicular wires. The memristive junctions are formed at the intersections between the upper wires and the lower wires. As discussed above, the memristive junctions can be programmed to vary the electrical resistance between the upper wires and lower wires.

Figure 2:
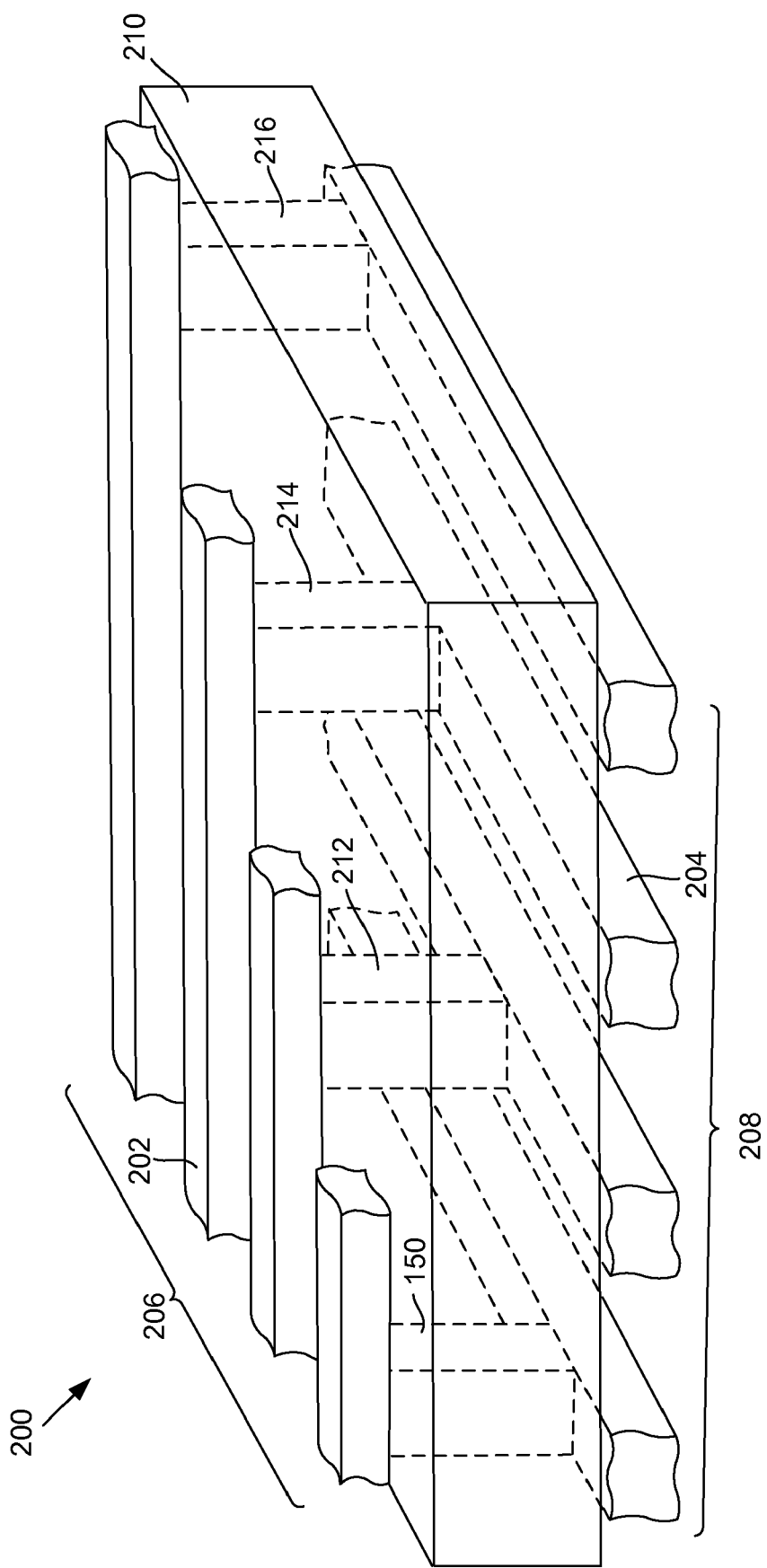
FIG. 2 is an isometric view of an illustrative nanowire crossbar architecture incorporating memristive elements, according to one embodiment of principles described herein.

FIG. 2 shows an isometric view of an illustrative nanowire crossbar architecture (200). As discussed above, the crossbar array (200) is composed of a lower layer of approximately parallel nanowires (208) that are overlain by an upper layer of approximately parallel nanowires (206). The nanowires of the upper layer (206) are roughly perpendicular, in orientation, to the nanowires of the lower layer (208), although the orientation angle between the layers may vary. The two layers of nanowires form a lattice, or crossbar, in which each nanowire of the second layer (206) overlies all of the nanowires of the first layer (208). The memristive matrices (105, 212, 214, 216) are formed between the crossing nanowires at these intersections to create a memristive junction. Consequently, each wire (202) in the upper layer (206) is connected to every wire in the lower layer (208) through a memristive junction and visa versa. At the intersections, the upper nanowires (206) form the first electrode (110, FIG. 1) and the lower nanowires (208) form the second electrode (115, FIG. 1). These junctions may perform a variety of functions including providing programmable switching between the nanowires. Because every wire in the first layer of nanowires (208) intersects each wire in the second layer of nanowires (206), placing a memristive junction at each intersection allows for any nanowire in the first layer (208) to be selectively connected to any wire in the second layer (206).

According to one illustrative embodiment, the nanowire crossbar architecture (200) may be used to form a nonvolatile memory array. Each of the memristive junctions (105, 212, 214, 216) may be used to represent one or more bits of data. For example, in the simplest case, a memristive junction may have two states: a conductive state and a nonconductive state. The conductive state may represent a binary "1" and the nonconductive state may represent a binary "0", or visa versa. Binary data can be written into the crossbar architecture (200) by changing the conductive state of the memristive junctions. The binary data can then be retrieved by sensing the state of the memristive junctions (105, 212, 214, 216).

Although individual nanowires (202, 204) in FIG. 2 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers may be fabricated using a variety of techniques including conventional photolithography as well as mechanical nanoimprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

The example above is only one illustrative embodiment of the nanowire crossbar architecture (200). A variety of other configurations could be used. For example, the crossbar architecture (200) can incorporate memristive junctions (105, 212, 214, 216) which have more than two states. In another example, crossbar architecture can be used to form implication logic structures and crossbar based adaptive circuits such as artificial neural networks.

According to one illustrative embodiment, a nanowire cross bar memory or other memristive device is integrated into CMOS or other conventional computer circuitry. This CMOS circuitry can provide additional functionality to the memristive device such as input/output functions, buffering, logic, or other functionality.

Figure 3:
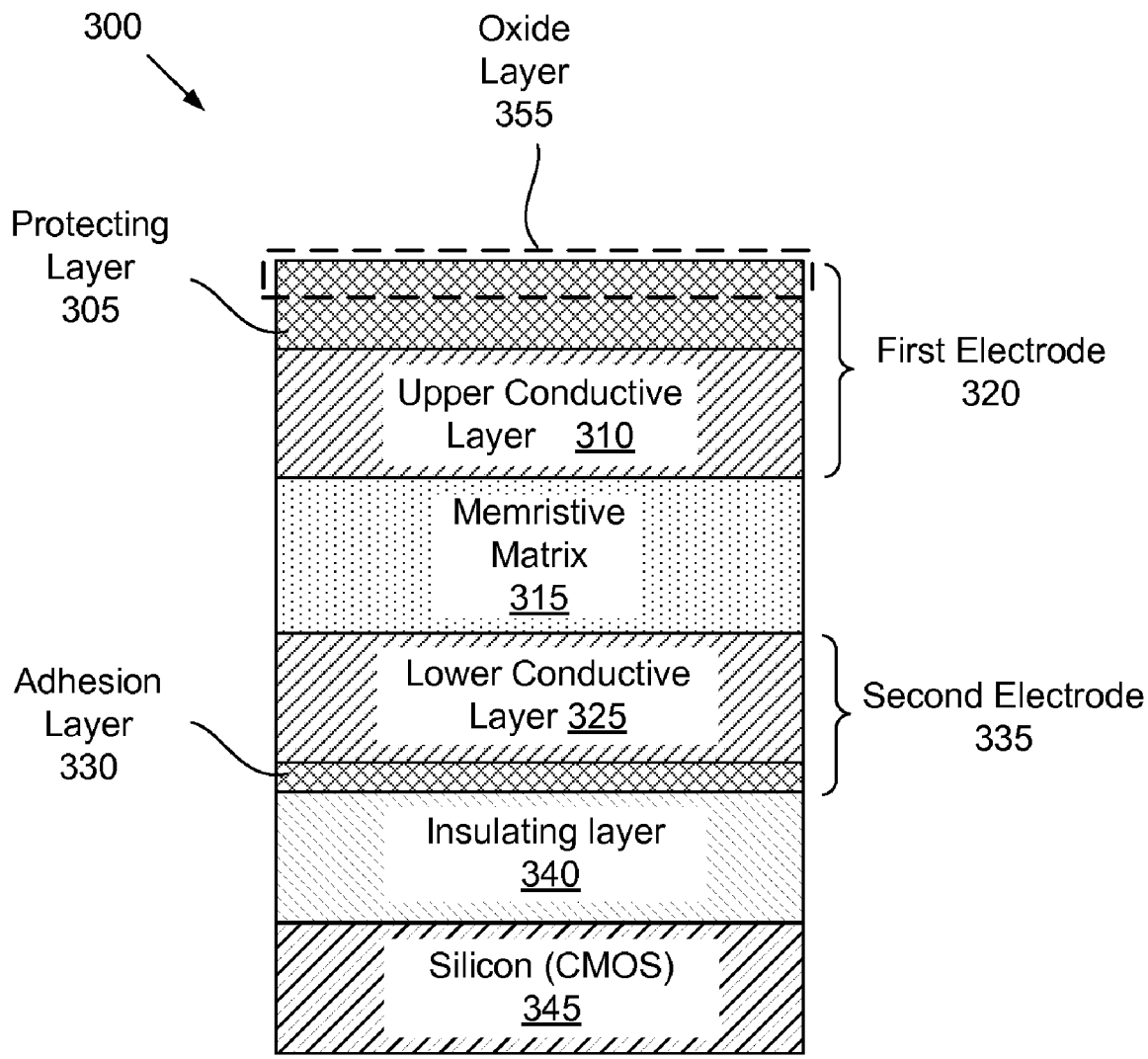
FIG. 3 is a cross-sectional view of an illustrative memristive device with bimetallic electrodes, according to one embodiment of principles described herein.

FIG. 3 is a cross-sectional diagram of an illustrative memristive device (300). According to one illustrative embodiment, the memristive device (300) may be formed on a semiconducting base. For example, the memristive device (300) may be formed on a semiconducting silicon base (345) which also includes CMOS circuit elements. An insulating layer (340) is formed on top of the silicon layer (345) to protect against undesirable electrical interaction between the memristive device (300) and the underlying silicon or CMOS circuit elements (345).

According to one illustrative embodiment, the second electrode (335) can be made up of a lower adhesion layer (330) and a lower conductive layer (325). The second electrode (335) may be a nanowire within a nanowire array. Similarly, the first electrode (320) may be made up of an upper conductive layer (310) and a protective layer (305).

The conductive layers (310, 325) could be made up of noble metals (such as platinum, palladium, etc.), nickel, tungsten, or other suitable metals or metal compounds. These metals are generally less chemically reactive with memristive matrices and do not dramatically reduce the oxide memristive layer. According to one illustrative embodiment, the conductive layers (310, 325) are formed from platinum.

The protective and adhesion layers (305, 330) may serve a number of functions. For example, the adhesion layer (330) may serve as an adhesion layer between the platinum layer (325) and the underlying insulating layer (340). This provides for a better mechanical bond between the two layers and increases heat conduction and the overall robustness. In some illustrative embodiments, the adhesion layer (330) may diffuse into the platinum layer (325) during higher temperature manufacturing steps. When the adhesion layer (330) interacts with the titanium dioxide memristive matrix (315), the metal which forms the adhesion layer chemically attaches to the oxygen atoms within the titanium dioxide matrix. This forms additional oxygen vacancies within the matrix which are the mobile dopant species in the memristive device (300). As discussed above, a number of other memristive matrix materials could be used. For example, titanium dioxide ($TiO_2$), zirconium dioxide ($ZrO_2$), hafnium dioxide ($HfO_2$), and strontium titanate ($SrTiO_3$) all use oxygen vacancies as mobile dopants. According to one illustrative embodiment, the memristive matrix (315) is titanium dioxide.

By way of example and not limitation, the adhesion layer could be formed from a metal which reduces the memristive matrix to form oxygen vacancies. These metals may include lithium, aluminum, and magnesium, which dramatically reduce titanium dioxide to titanium metal. Less reactive materials include chromium, manganese, and vanadium, which all reduce titanium dioxide. According to one illustrative embodiment, the adhesion and protecting layers (330, 305) are formed from aluminum or chromium. Throughout the remainder of the specification, chromium will be used as an illustrative adhesion and protecting metal and platinum will be used as an illustrative less-reactive metal.

Additionally, the protective layer (305) may protect the underlying layers from chemical attack during manufacturing processes which include etching. For example, after deposition, the protective layer (305) may interact with atmospheric oxygen to form a very dense, hard layer of oxide (355) on its upper surface. This oxide (355) protects the upper less reactive layer (310) from undesirable erosion during etching processes. Additionally, the protective layer itself may have a high resistance to chemical attack and can help shield the layers even if its oxide layer is compromised.

Figure 4:
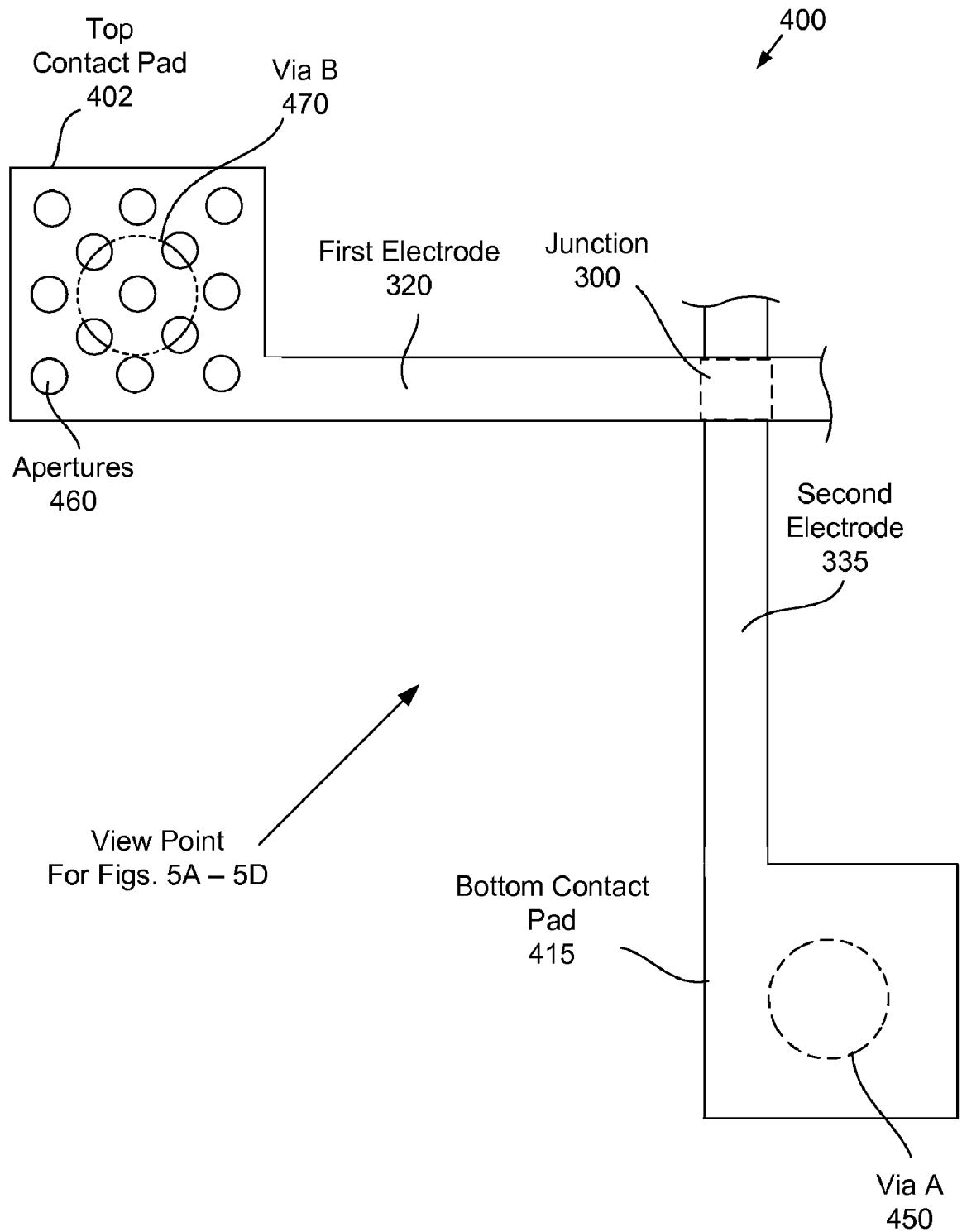
FIG. 4 is a top view of an illustrative memristive junction and underlying complimentary metal-oxide-semiconductor (CMOS) contact vias, according to one embodiment of principles described herein.

FIG. 4 is a top view of a portion of an integrated circuit (400) which includes a memristive junction (300) which is formed at the intersection between two overlapping bimetallic electrodes (320, 335). According to one illustrative embodiment, the bimetallic electrodes (320, 335) are components within a larger crossbar array. The bimetallic electrodes (320, 335) terminate in contact pads (402, 415) which have underlying vias (470, 450). According to one illustrative embodiment, the bottom pad (415) may be in direct electrical contact with via A (450). However, the top pad (402) may be separated from the via B (470) by one or more intervening layers. The top pad (402) is formed with a number of apertures (460) which provide access to the underlying via (470). The underlying vias (470, 450) are connected to CMOS circuitry. By making a connection between the pads (402, 415) and underlying vias (470, 450) an electrical connection is created between the CMOS circuitry. The CMOS circuitry can then provide programming and access to the various memristive junctions within the cross-bar array.

Figure 5A:
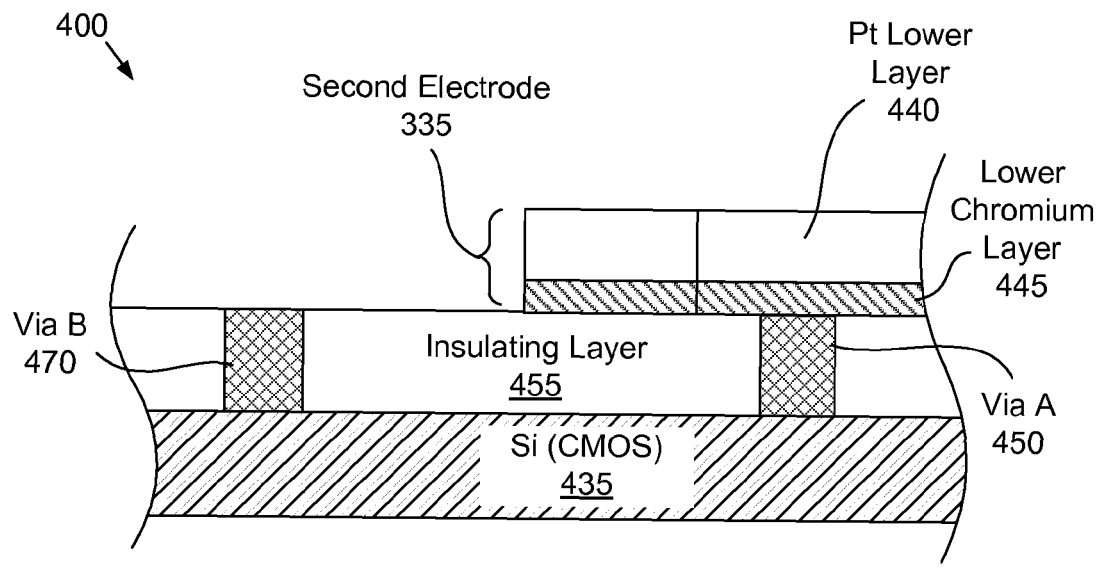
FIGS. 5A-5D are cross-sectional views of an illustrative manufacturing steps in constructing a vertically integrated circuit which includes CMOS circuitry and memristive elements, according to one embodiment of principles described herein.

FIGS. 5A-5D are cross-sectional views of the system of FIG. 4 which show illustrative manufacturing steps in constructing an integrated circuit (400) which includes CMOS circuitry and memristive elements. FIG. 5A shows an intermediate step in which an insulating layer (455) is deposited over the CMOS layer (435). The CMOS layer (435) may include a variety of materials, layers and structures which form the underlying CMOS circuitry. For purposes of illustration, the details of the CMOS layer (435) have not been shown. According to one illustrative embodiment, the insulating layer may be a tetraethylorthosilicate (TEOS) layer. The TEOS layer (455) may act as a barrier which prevents undesirable contamination of the CMOS layer (435). Additionally, the TEOS layer (455) electrically insulates the CMOS layer (435). A number of contact vias (450, 470) may extend through the insulating layer (455). Above the insulating layer (455), a lower chromium layer (445) and platinum lower electrode (440) may be deposited to form the second electrode (335) and pad (415, FIG. 4). In this embodiment, the lower chromium layer (445) is in direct electrical contact with the underlying via A (450).

Figure 5B:
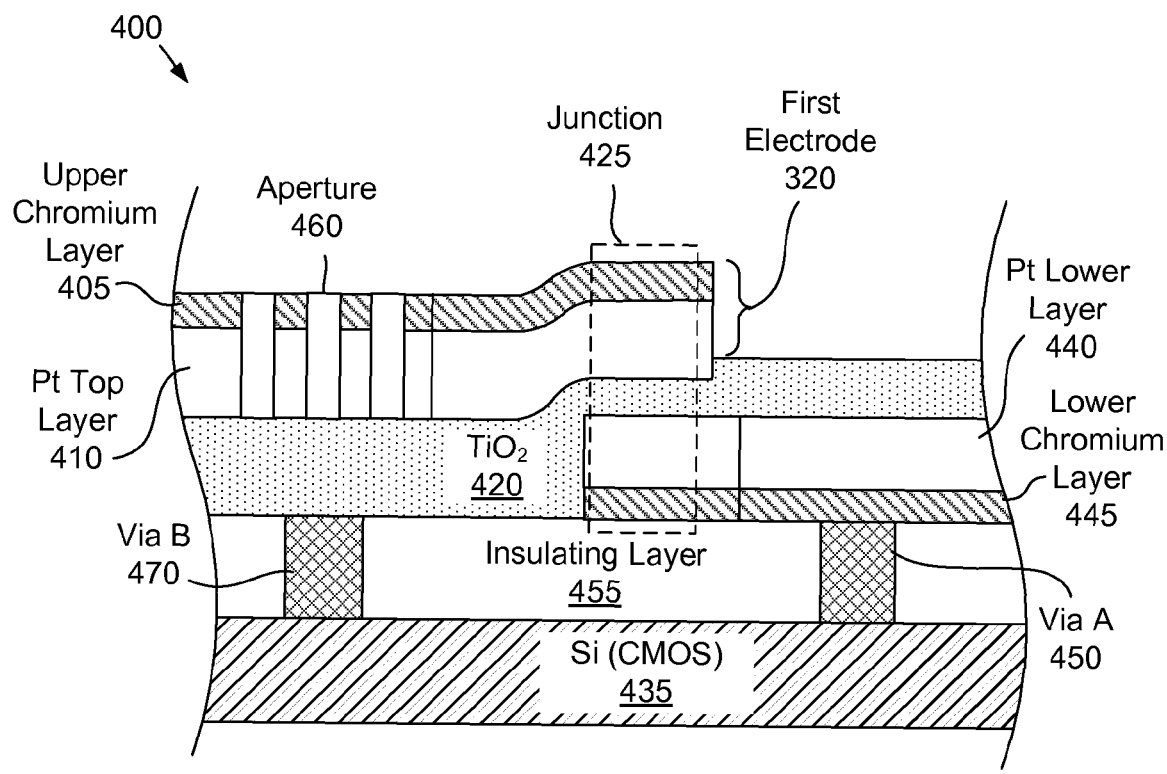

FIG. 5B shows the addition of several more layers, including a titanium dioxide memristive layer (420) and the upper platinum and chromium layers (405, 410) which form the first electrode (320). At this point, the memristive junction (425) is fully formed. According to one illustrative embodiment, the bottom contact pad (415) is in direct electrical contact with the via A (450). However, an electrical connection between the first electrode (320) and the underlying contact via B (470) has not yet been formed. In other embodiments, a planarization layer may be formed above the insulating layer (455). In this case, neither of the contact pads (402, 415; FIG. 4) will have formed electrical contact with the underlying vias (450, 470). As discussed above, contact pads which are not in direct electrical contact with the underlying vias may have a number of apertures (460) which facilitate making these electrical connections.

In some embodiments, the lower chromium layer (445) may be separated from the via A (450) by a planarization layer (not shown). In this case, the bottom contact pad (415, FIG. 4) would have a number of apertures similar to those in the top contact pad (402, FIG. 4). These apertures in the bottom contact pad (415, FIG. 4) would allow an electrical contact to be made with the underlying via A (450) in the same manner that electrical contact is formed between the top contact pad (402) and the underlying via B (470).

Figure 5C:
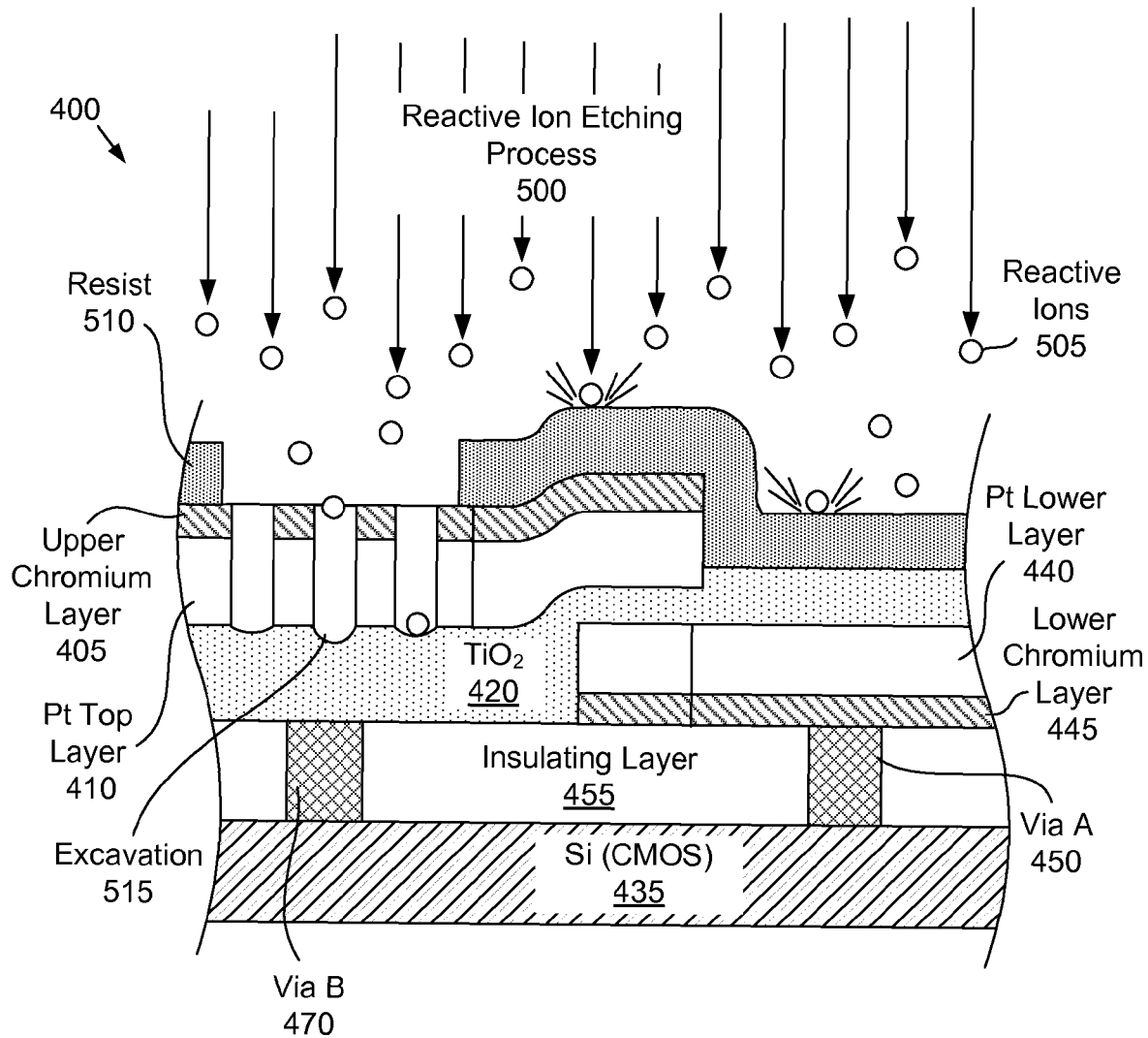

FIG. 5C shows a reactive ion etching process (500) which removes material to expose the contact via B (470). According to one illustrative embodiment, a resist layer (510) may be deposited to help protect the deposited structures. The resist layer (510) may be patterned to direct the etching process to the desired locations for material removal. The resist layer (510) has an aperture which exposes a portion of the upper surface of the upper chromium layer (405).

A number of different etching processes can be used, including reactive ion etching (500). Reactive ion etching uses chemically reactive plasma to remove material from a target workpiece. The plasma is generated in a vacuum by an oscillating electrical field. For example, an etching chamber may be evacuated and then one or more gases may be introduced into to the chamber. For example, titanium dioxide may be etched using mixture of fluoroform gas ($CHF_3$) and oxygen ($O_2$). Silicon dioxide may be etched using tetrafluoromethane ($CF_4$). The etching gases may be maintained between a few millitorr and a few hundred millitorr. A radio frequency electromagnetic field is than applied to the gas. This oscillating electric field ionizes the gas molecules by stripping them of electrons, thereby creating a plasma. The target workpiece is electrically isolated and builds up a large negative charge as electrons impact it. The positive ions (505) are electrically attracted to the workpiece and tend to drift toward it and collide with its surface. The ions chemically react with the materials on the surface of the wafer and can also knock off some material by transferring some of their kinetic energy.

A number of factors can be adjusted within the reactive ion etching process (500) to modify the etching process. For example, these factors may include changing components within the gas, the gas pressure, the gas flow, the frequency of the electrical field, the power of the electrical field, and other factors. These parameters may be adjusted to achieve the desired etching results for various materials and conditions.

FIG. 5C shows a number of reactive ions (505) drifting toward the workpiece (400) and impacting the exposed surfaces. Reactive ions (505) with higher kinetic energy can strike with enough force to physically eject small amounts of material from the surfaces. The ions also chemically attack the surface and erode it by making derivative compounds. For purposes of illustration, the size of the reactive ions (505) has been greatly enlarged.

The reactive ions (505) pass through openings in a resist layer (510) and into the apertures (460, FIG. 5B) to create an excavation (515) which eventually exposes the via (470). As discussed above, the upper chromium layer (405) may include a dense layer of oxide which protects the underlying material. Additionally, the chromium within the chromium layer (405) has the characteristics of having a high immunity to chemical attack. The chromium layer (405) protects the underlying and vulnerable platinum nanowire during from the etching process (500). Consequently, by covering the platinum layer (410) with a coating of chromium, there can be more flexibility in the reactive ion etching process (500). For example, a greater variety of reactive gases or a higher electrical voltage could be used without etching away the platinum nanowire.

In situations where the lower electrode pad area is exposed to etchants, the lower chromium layer (445) also help maintain the integrity of the lower electrode. For example, even if a large portion of the lower platinum layer (440) is etched away, the lower chromium layer (445) will maintain the electrical conductivity and physical integrity of the lower contact pad (415).

Figure 5D:
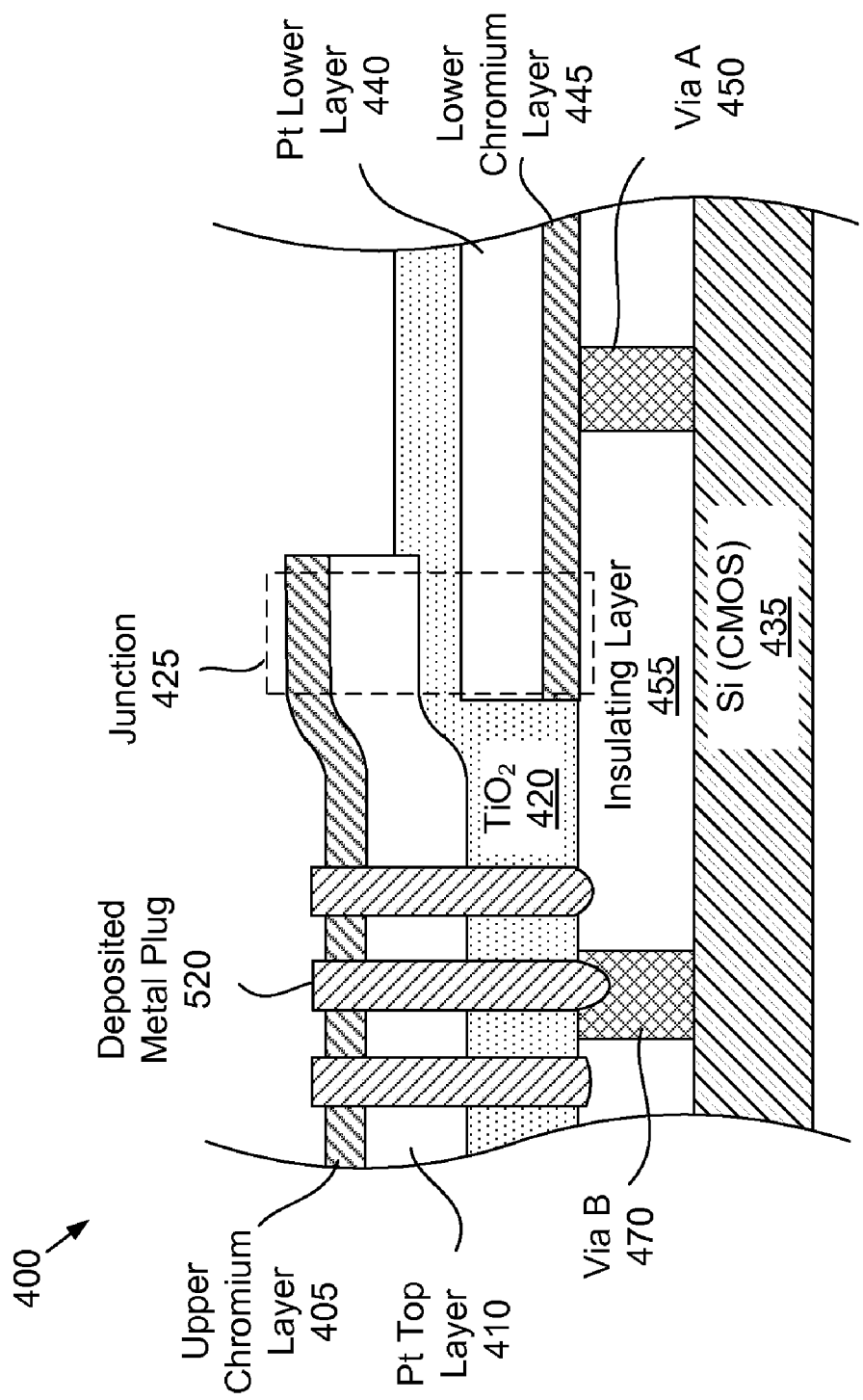

FIG. 5D is a cross-sectional view of an illustrative integrated circuit in which metal plugs (520) have been deposited in excavations (515, FIG. 5C) formed during the etching process (500, FIG. 5C). These metal plugs (520) electrically connect the via B (470) to the upper electrode contact pad (415, FIG. 4). The metal plugs (520) may be made up of a number of conductive materials which may be deposited using a variety of techniques. For example, the plugs (520) may be made up of platinum, iridium, tungsten, aluminum, or other suitable material. These metals may be deposited using chemical vapor deposition, atomic layer deposition, ion plating, physical vapor deposition, sputtering, plasma-enhanced chemical vapor deposition, or other suitable technique.

Figure 6B:
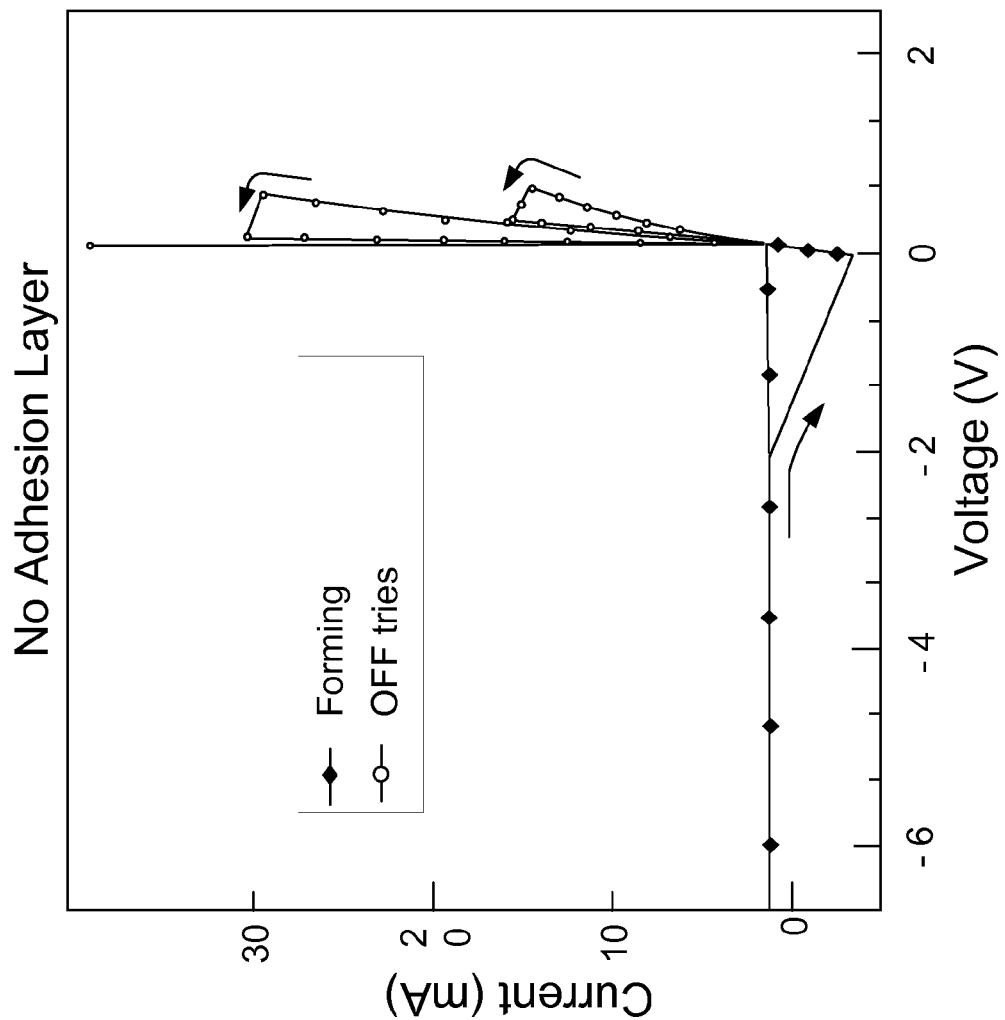
FIG. 6B is a graph showing illustrative voltages and currents which have been applied to a memristive element, according to one embodiment of principles described herein.
Figure 6A:
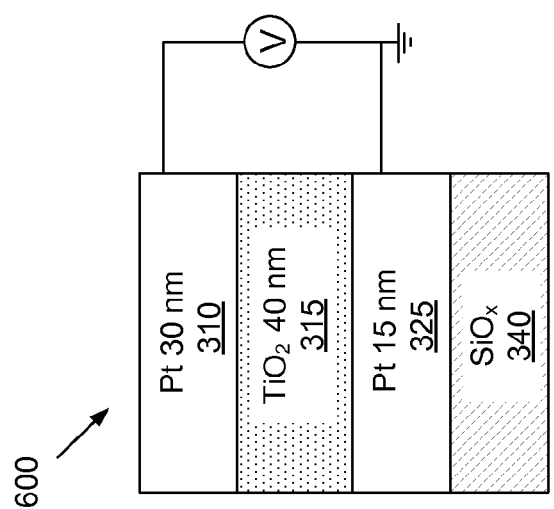
FIG. 6A is a cross-sectional diagram of an illustrative memristive element which has no adhesion layer between a lower electrode and an underlying substrate, according to one embodiment of principles described herein.

A number of tests were performed to evaluate the suitability of various bi-metallic electrodes for use within memristor junctions. FIGS. 6A and 6B show illustrative test results for a memristive junction which does not use a bi-metallic electrode. FIGS. 6A and 6B can be used as a baseline for comparison of other geometries which incorporate bimetallic electrodes presented in FIGS. 7A, 7B, 8A, and 8B.

FIG. 6A is a cross-sectional diagram of a memristive junction (600) which has no adhesion layer between a second electrode (325) and an underlying silicon oxide substrate (340). According to one illustrative embodiment, the first electrode (310) is made up of an upper platinum layer which has a thickness of approximately 30 nanometers. The titanium dioxide memristive matrix (315) has a thickness of approximately 40 nanometers. The second electrode (325) is also made up of platinum and has a thickness of approximately 15 nanometers. The silicon oxide base layer (340) forms the support for the structure. The surface area of the memristive junction (600) in this illustrative embodiment is approximately 100 $\mu m^2$. During the testing, a voltage V is applied across the first electrode (310) and the second electrode (325). According to one illustrative embodiment, the second electrode (325) is connected to ground or a reference voltage and the voltage on the first electrode (310) is varied.

FIG. 6B is a graph showing illustrative voltages and currents which have been applied to the memristive element (600) during the tests. A first negative forming voltage is applied as shown by the line with diamond markers labeled "Forming." In this test, the forming voltage was approximately negative six volts. As discussed above, the forming voltage may be higher than other voltages applied to the junction (600) and is used to form the junction and define its characteristics. For example, the forming voltage may create additional mobile dopants or encourage the migration of the mobile dopants into more active regions of the memristive matrix (315).

After the negative forming voltage was applied on the top electrode, the memristive junction is in the fully ON (conductive) state. In this state, the memristive junction (600) forms an electrical connection between the upper platinum electrode (310) and the lower platinum electrode (325). Subsequently, a reverse voltage is applied to bring the memristive junction (600) into the OFF (non-conductive) state. However, successive attempts to turn off the memristive junction (600) were not successful. As shown by the line with open circles in FIG. 6B, several attempts were made to turn off the junction (600). In a first attempt, a relatively low current was used. In a second attempt, a higher current passed through the junction (almost 30 milliamps). After a number of attempts to turn the junction OFF state, the junction (600) was permanently shorted in ON position.

Figure 7B:
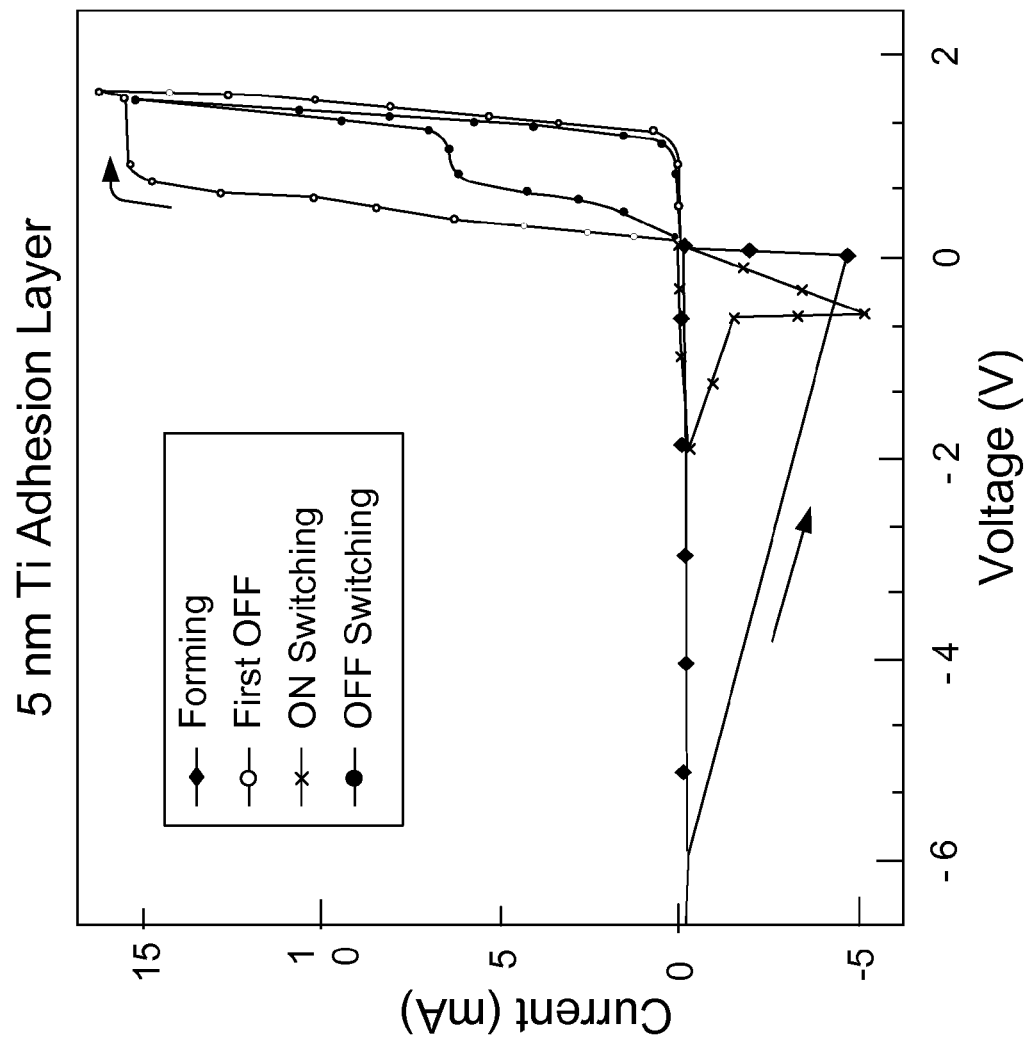
FIG. 7B is a graph showing illustrative voltages and currents which have been applied to a memristive element with a titanium adhesion layer, according to one illustrative embodiment of principles described herein.
Figure 7A:
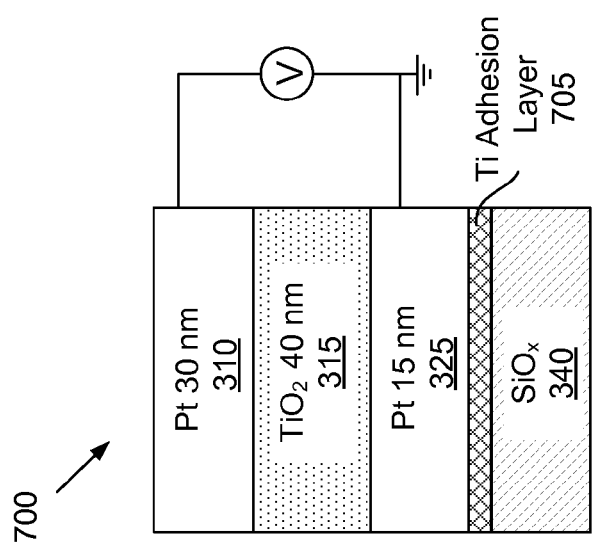
FIG. 7A is a cross-sectional diagram of an illustrative memristive element which has a titanium adhesion layer between a lower electrode and an underlying substrate, according to one embodiment of principles described herein.

FIG. 7A is a cross-sectional diagram of a memristive junction (700) which has a titanium adhesion layer (705) between a second electrode (325) and an underlying silicon oxide substrate (340). As discussed above, this additional layer may serve a number of functions including increasing the mechanical adhesion of the platinum layer (325) to the underlying matrix (340) and creating additional mobile dopants within the memristive matrix (315).

FIG. 7B illustrates a number of tests which were performed to evaluate the robustness and performance of the memristive junction (700). As described above with respect to FIG. 6B, a forming voltage was first applied to the memristive junction (700). The forming current/voltage is illustrated in FIG. 7B as a curve with diamonds. The forming voltage approached negative six volts and passed approximately negative five milliamps through the memristive junction (700). This voltage/current formed the memristive junction (700) into its fully ON state.

Next a reverse voltage was applied to the memristive junction (700) to change it to the OFF state. This first OFF voltage is illustrated in FIG. 7B as a line with open circles. The first OFF voltage resulted in a small positive voltage gradient and a current of approximately 15 milliamps. This successfully changed the state of the memristive junction (700) to the OFF state.

The memristive junction was then successfully switched back and forth between ON and OFF states using an ON switching voltage (illustrated as a curve with crosses) and an OFF switching voltage (illustrated as a curve with solid circles). Ideally, the memristive junction (700) would be capable of switching back and forth between ON and OFF state a large number of times before its performance begins to degrade. Additionally, the state of the memristive junction (700) should be stable over a period of time between the application of these programming voltages.

FIG. 8A is a cross-sectional diagram of a memristive element which has a chromium adhesion layer (330) between a second electrode (325) and an underlying silicon oxide substrate (340). According to one illustrative embodiment, the first electrode (310) is platinum with a thickness of between approximately 5 and 50 nanometers; the memristive matrix is between approximately 20 and 100 nanometers in thickness; and the second electrode (325) is platinum with a thickness of between approximately 5 to 50 nanometers. The chromium layer (330) is approximately 2 to 30 nanometers in thickness.

In one illustrative embodiment, the upper platinum layer (310) is approximately 30 nanometers thick; the titanium dioxide memristive matrix (315) is approximately 40 nanometers thick; and the platinum bottom electrode (325) is approximately 15 nanometers thick.

As discussed above, this chromium layer (330) may increase the mechanical adhesion of the platinum layer (325) to the underlying matrix (340). Additionally, the chromium may diffuse through the platinum electrode (325) to chemically interact with the titanium dioxide or other memristive matrix. The chromium has a relatively high affinity for oxygen and may remove oxygen atoms from the memristive matrix to form additional mobile dopants within the memristive matrix. (315).

According to one illustrative embodiment, an additional chromium layer deposited may be deposited over the top platinum electrode (310) as shown in FIGS. 3, 4, and 5A-5D. The upper surface of the chromium layer may then be exposed to oxygen to produce a dense, durable layer of chromium oxide. This layer of chromium oxide is resistant to several etching processes and protects the underlying material from erosion.

FIG. 8B is a graph showing illustrative voltages and currents which have been applied to a memristive element (800) with a chromium adhesion layer (330). The graph shows results of performing the same steps as described above with respect to FIG. 7B, namely: forming (curves with diamonds); a first OFF voltage (curves with open circles); ON switching (curves with crosses); and OFF switching (curves with solid circles.

The memristive junctions (700, 800) which included a bi-metallic lower electrode both exhibited more stable and repeatable characteristics that the memristive junction (600, FIG. 6A-6B) which did not have a lower bimetallic electrode. Without subscribing to any particular theory, it appears that a bimetallic electrode which is comprised of a more reactive metal and noble metal improves the performance of memristive junctions. The more reactive metal layer may perform a number of functions to improve the mechanical and electrical stability of a memristive junction, protect the memristive junction from chemical or physical erosion, and generate additional mobile dopant species within the memristive matrix. Therefore, the criterion for selecting a metal for the adhesion and protection layers are that the metal is 1) able to reduce the memristive oxide layer and generate oxygen vacancies 2) able to resist the RIE etching process.

Figure 9:
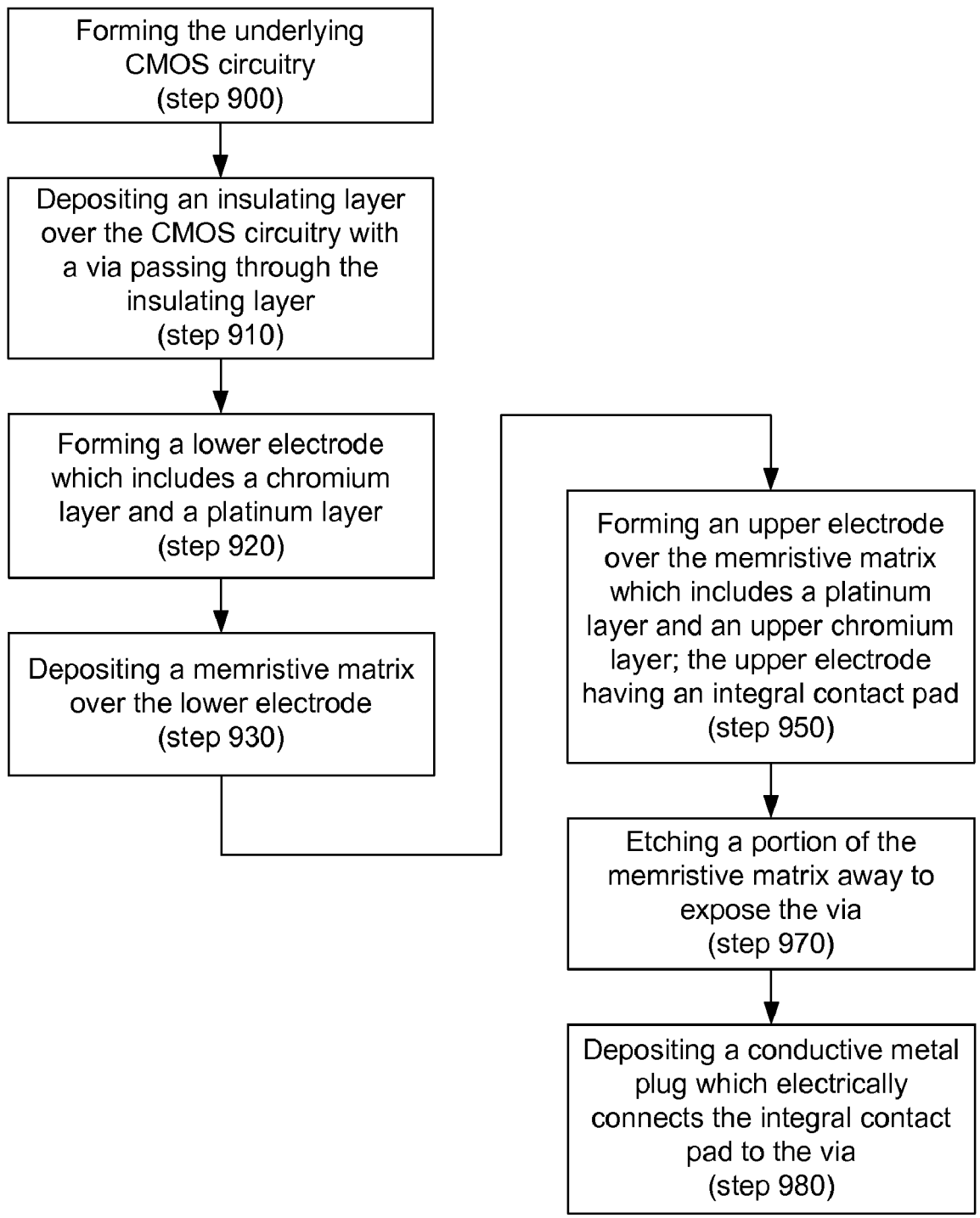
FIG. 9 is a flow chart showing an illustrative method for constructing a vertically integrated circuit which includes comprising a crossbar architecture and underlying CMOS circuitry, according to one embodiment of principles described herein.

FIG. 9 is a flow chart showing an illustrative method for constructing a vertically integrated circuit which includes a crossbar architecture and underlying CMOS circuitry. A first step includes forming the underlying CMOS circuitry (step 900). An insulating layer with one or more vias is then deposited over the CMOS circuitry. The via is in electrical contact with the underlying CMOS circuitry (step 910). According to one illustrative embodiment, a lower bimetallic electrode is formed from a chromium layer and a platinum layer (step 920) and the memristive matrix is deposited over the lower electrode (step 930). The lower electrode is heated by some previous or subsequent process such that the chromium layer diffuses through the platinum layer to create oxygen vacancies within the memristive matrix. In some embodiments, the chromium layer may diffuse through the platinum layer during the deposition of the memristive matrix. For example, the memristive matrix can be hot-deposited on the lower electrode which is held at an elevated temperature during the deposition process. According to one illustrative embodiment, the temperature of the lower electrode during the hot-deposition process is approximately 250 C. A first bimetallic electrode is formed over the memristive matrix. The first electrode includes a platinum layer and an upper chromium layer and extends to form an integral pad (step 950). The upper chromium layer is exposed to oxygen to form an etch resistant oxide layer. Additionally or alternatively, the upper chromium layer may have native oxide which forms without intentional or atmospheric exposure of the surface to oxygen. A resist layer can then be deposited and the etching process can be used to expose the via (step 970). A conductive metal plug is then formed which electrically connects the integral contact pad to the via (step 980).

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive device having a bi-metallic electrode comprises:
    a memristive matrix;
    a first electrode in electrical contact with the memristive matrix; and
    a second electrode in electrical contact with the memristive matrix and an underlying layer,
    in which at least one of the first and second electrodes is a bi-metallic electrode, the bi-metallic electrode comprising a conducting layer and a metallic layer.

2. The device of claim 1, in which the conducting layer comprises one or more: a noble metal, nickel, or tungsten.

3. The device of claim 1, in which the conducting layer comprises platinum.

4. The device of claim 1, in which the metallic layer comprises one or more of: lithium, aluminum, magnesium, chromium, manganese, and vanadium.

5. The device of claim 1, in which the second electrode is a bi-metallic electrode, the bi-metallic electrode comprising a metallic adhesion layer interposed between the underlying layer and the conducting layer.

6. The device of claim 5, in which the metallic adhesion layer diffuses through the conductive layer and chemically interacts with the memristive matrix.

7. The device of claim 5, in which the conductive layer comprises platinum between 5 and 50 nanometers in thickness and the metallic adhesion layer comprises chromium between 2 and 30 nanometers in thickness.

8. The device of claim 1, in which the first electrode is a bi-metallic electrode, the bi-metallic electrode comprising a metallic protective layer and a conducting layer.

9. The device of claim 8, in which the metallic protective layer is placed on an upper surface of the conducting layer.

10. The device of claim 9, further comprising an oxide layer formed on an outer surface of the metallic protective layer, the oxide layer being configured to protect the conductive layer during etching processes.

11. The device of claim 1, further comprising a via, the via being configured to be connected to underlying CMOS circuitry and extending upward through an insulating layer.

12. The device of claim 11, in which the bi-metallic electrode comprises a pad with an aperture; an etching process being configured to etch material through the aperture to expose the via.

13. The device of claim 11, further comprising a metal plug deposited through the aperture; the metal plug being configured to make an electrical connection between the via and the pad.

14. A vertically integrated circuit comprising:
    CMOS circuitry having a via extending upward through an insulating layer;
    a memristive device having a bi-metallic electrode configured to overlay the CMOS circuitry and insulating layer, the bi-metallic electrode comprising:
        a layer of platinum;
        a layer of chromium; and
        contact pad with an aperture;
    and a metallic plug configured to extend through the aperture to make electrical contact between the via and the pad.

15. A method of forming a memristive device having a bi-metallic electrode comprising:
    forming a memristive matrix;
    forming a first electrode in electrical contact with the memristive matrix; and forming a second electrode in electrical contact with the memristive matrix and an underlying layer, in which at least one of the first and second electrodes is a bi-metallic electrode, the bi-metallic electrode comprising a conducting layer and a metallic layer.

16. A memristive device having a bi-metallic electrode comprises:
a memristive matrix;
a first electrode in electrical contact with the memristive matrix; and
a second electrode in electrical contact with the memristive matrix and an underlying layer,
a via, the via being configured to be connected to underlying CMOS circuitry and extending upward through an insulating layer; and
in which at least one of the first and second electrodes is a bi-metallic electrode, the bi-metallic electrode comprising a conducting layer and a metallic layer.

17. The device of claim 16, in which the bi-metallic electrode comprises a pad with an aperture; an etching process being configured to etch material through the aperture to expose the via.

18. The device of claim 16, further comprising a metal plug deposited through the aperture; the metal plug being configured to make an electrical connection between the via and the pad.

19. The device of claim 16, in which the second electrode is a bi-metallic electrode, the bi-metallic electrode comprising a metallic adhesion layer interposed between the underlying layer and the conducting layer, the conductive layer comprising platinum between 5 and 50 nanometers in thickness and the metallic adhesion layer comprising chromium between 2 and 30 nanometers in thickness.

* * * * *